(12) United States Patent
Chou et al.

(10) Patent No.: US 8,941,232 B2
(45) Date of Patent: Jan. 27, 2015

(54) METAL BUMPS FOR COOLING DEVICE CONNECTION

(75) Inventors: You-Hua Chou, Taipei (TW); Yi-Jen Lai, Chang Hua (TW); Chun-Jen Chen, Jhubei (TW); Perre Kao, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 737 days.

(21) Appl. No.: 13/034,263

(22) Filed: Feb. 24, 2011

(65) Prior Publication Data
US 2012/0217628 A1 Aug. 30, 2012

(51) Int. Cl.
*H01L 23/34* (2006.01)
*H01L 23/367* (2006.01)
*H01L 23/42* (2006.01)

(52) U.S. Cl.
CPC ............ *H01L 23/3677* (2013.01); *H01L 23/42* (2013.01); *H01L 2224/16145* (2013.01); *H01L 2924/15311* (2013.01)
USPC ........... 257/712; 257/714; 257/717; 257/777; 257/780; 257/E23.021; 257/E23.08; 257/E23.101; 257/E23.169

(58) Field of Classification Search
USPC ......... 257/712, 713, 717, 777, 778, 780, 784, 257/E23.02, E23.021, E23.023, E23.069, 257/E23.08, E23.101, E23.106, E23.169
See application file for complete search history.

(56) References Cited

U.S. PATENT DOCUMENTS

| | | | | |
|---|---|---|---|---|
| 8,193,625 B2 * | 6/2012 | Liu et al. | ......................... | 257/686 |
| 8,427,833 B2 * | 4/2013 | Barowski et al. | ............. | 361/704 |
| 2004/0080033 A1 * | 4/2004 | Fang | ............................. | 257/678 |
| 2006/0019430 A1 * | 1/2006 | Yoshimura | .................... | 438/122 |
| 2006/0148136 A1 * | 7/2006 | Odegard et al. | ............... | 438/127 |

OTHER PUBLICATIONS

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.

Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

U.S. Appl. No. 12/846,353, filed Jul. 29, 2010.
U.S. Appl. No. 12/842,617, filed Jul. 23, 2010.

* cited by examiner

*Primary Examiner* — Matthew E Warren
(74) *Attorney, Agent, or Firm* — Lowe Hauptman & Ham, LLP

(57) ABSTRACT

The mechanisms for forming metal bumps to connect to a cooling device (or a heat sink) described herein enable substrates with devices to dissipate heat generated more efficiently. In addition, the metal bumps allow customization of bump designs to meet the needs of different chips. Further, the usage of metal bumps between the semiconductor chip and cooling device enables advanced cooling by passing a cooling fluid between the bumps.

20 Claims, 12 Drawing Sheets

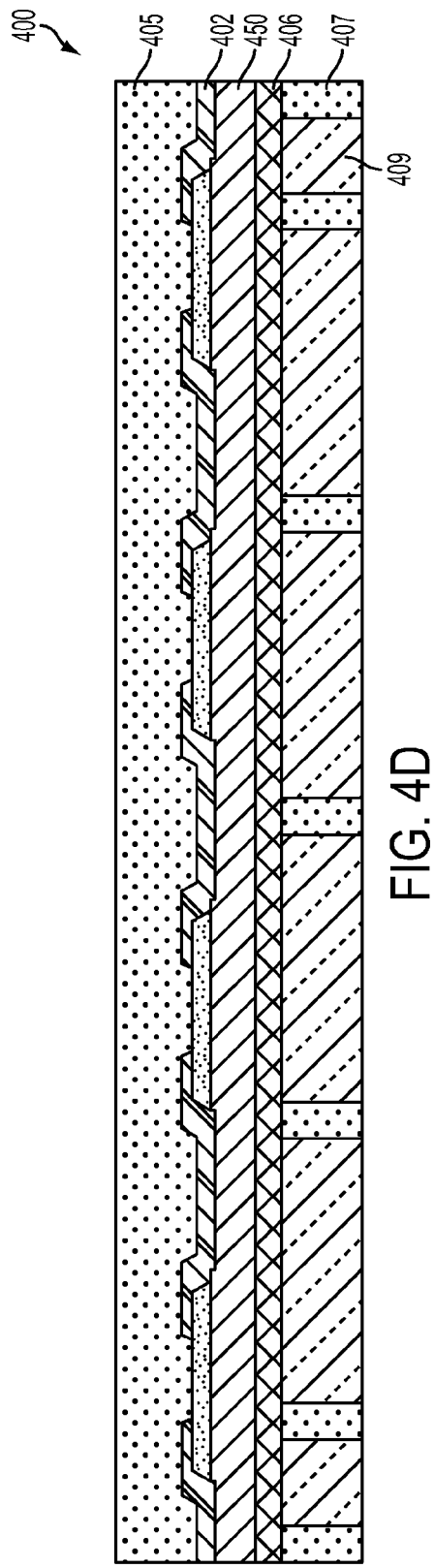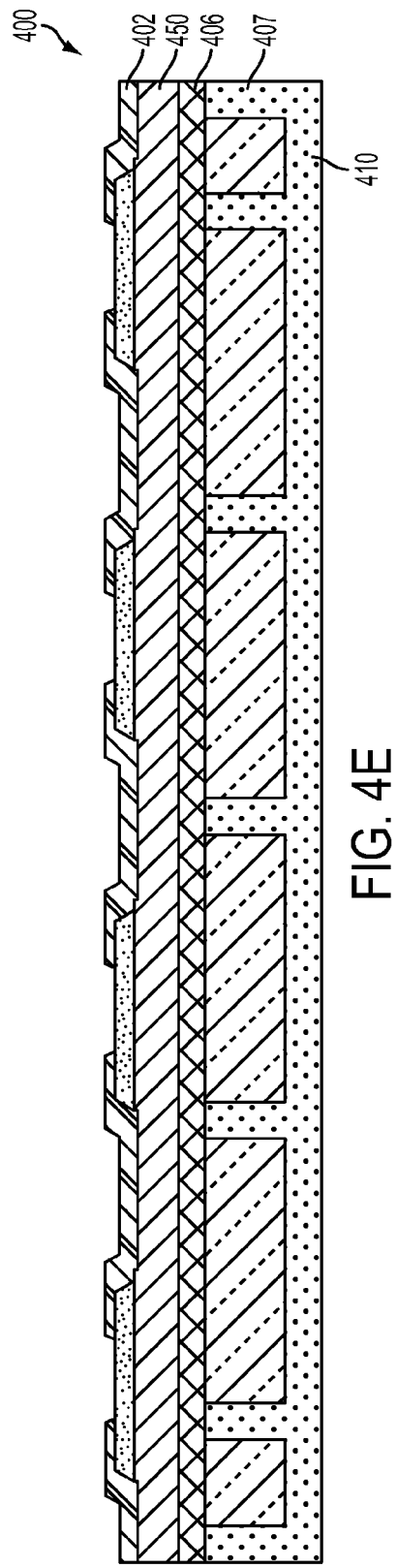
FIG. 4D
FIG. 4E

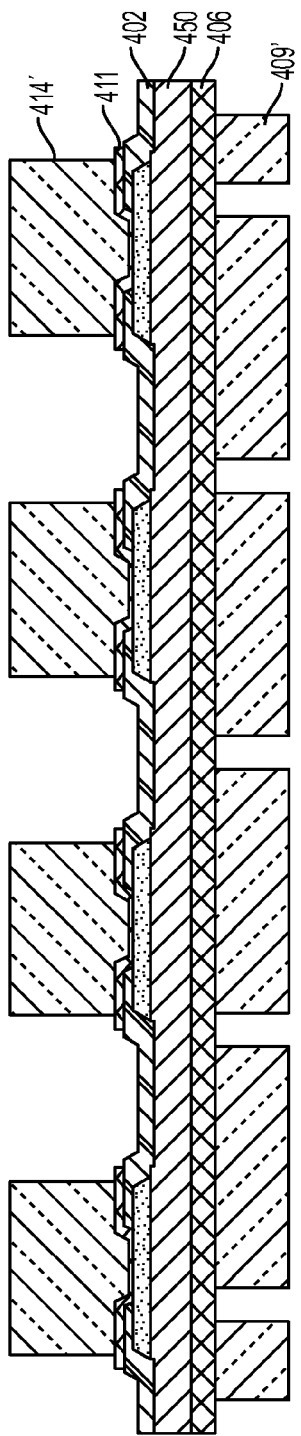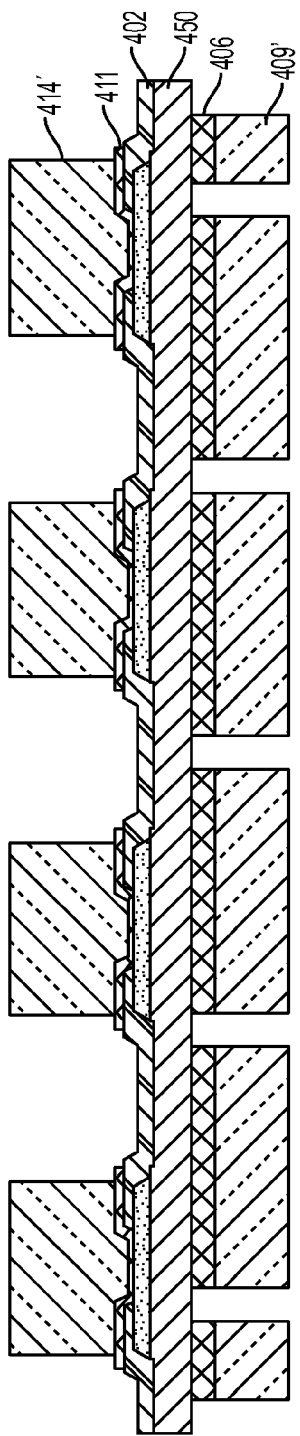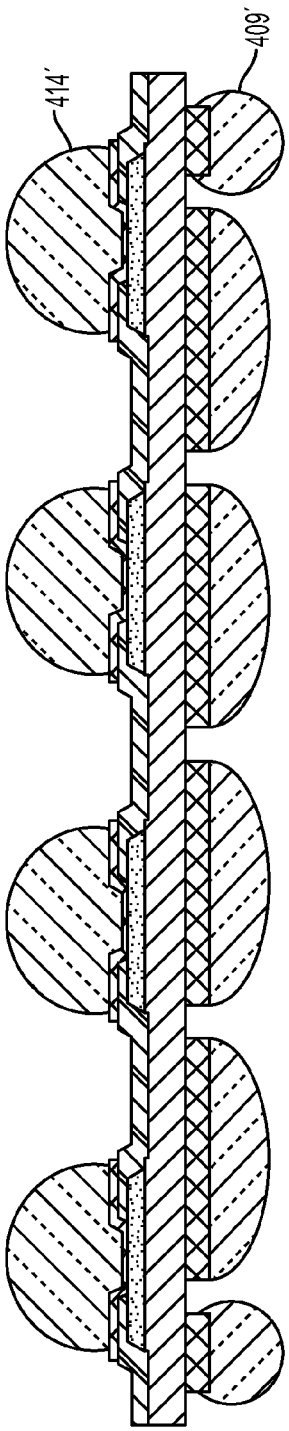

US 8,941,232 B2

METAL BUMPS FOR COOLING DEVICE CONNECTION

FIELD

This disclosure relates to the fabrication of integrated circuit devices, and more particularly, to the fabrication of bump structures in integrated circuit devices.

BACKGROUND

As integrated circuit (IC) wafer fabrication process technology advances from sub-micron to nanometers, the heat generated by ICs increases greatly due to the increased number of devices, such as transistors, as well as an increase in the device current leakage. Therefore, the package and system thermal performance becomes a concern for high performance integrated circuits (or integrated circuit devices, or chips).

Heat sinks (cooling devices) are sometimes used to dissipate heat generated by the devices. Most heat sinks are made of materials with high coefficients of thermal conductivity. Most heat sinks for such applications have pins, fins, and/or ridges, which are used to increase their surface areas. The large surface areas of heat sinks allow such surfaces to come in contact with the surrounding air and enable the heat generated by the high performance integrated devices (or circuits) to be dissipated more quickly.

The existing mechanisms of integrating packaged chips with heat sinks have their limits in heat dissipation. There is a need for new mechanisms for heat dissipation.

BRIEF DESCRIPTION OF THE DRAWINGS

The present disclosure will be readily understood by the following detailed description in conjunction with the accompanying drawings, and like reference numerals designate like structural elements.

FIGS. 4A-4L show cross-sectional views of a region of a substrate with integrated circuits (ICs) in a sequential process flow to prepare bumps for connecting with a heat sink, in accordance with some embodiments.

DETAILED DESCRIPTION OF THE EXEMPLARY EMBODIMENTS

Figure 1:
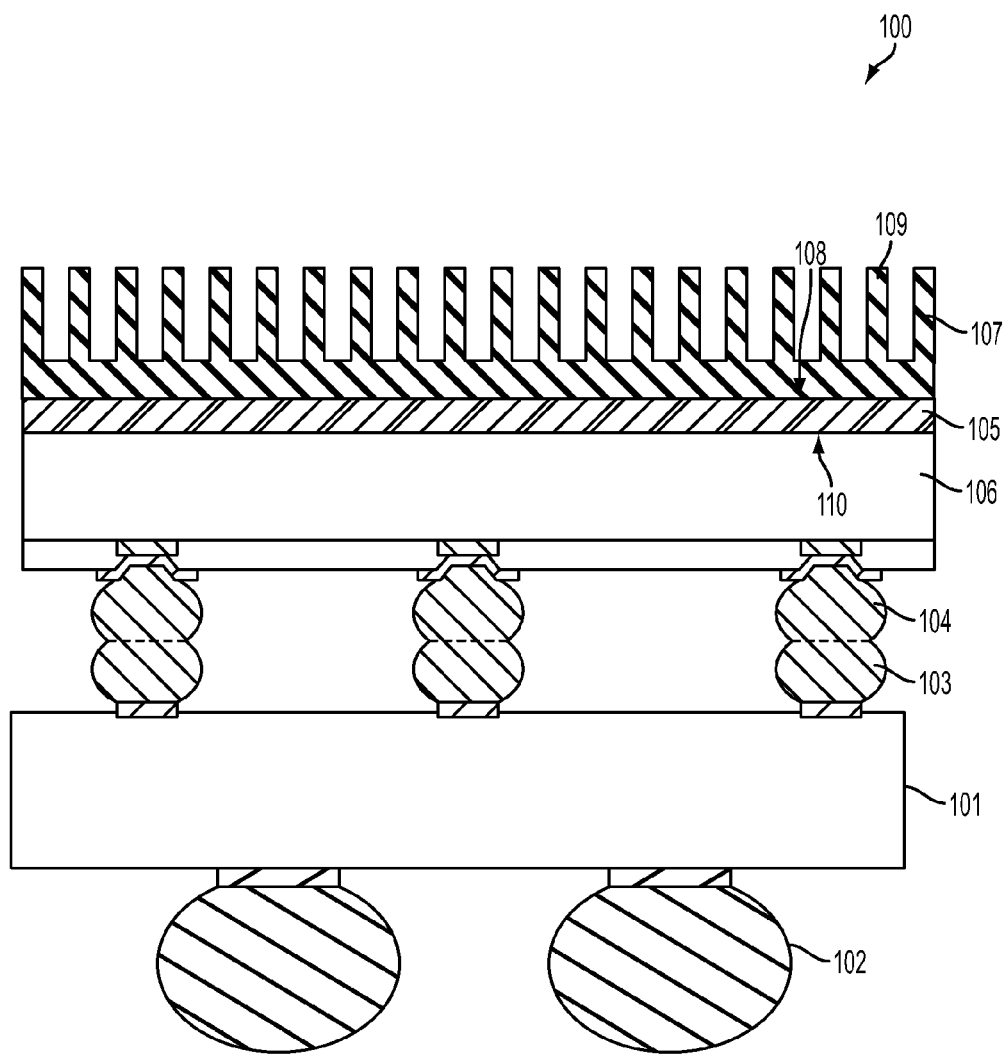
FIG. 1 shows a schematic side view of a flip-chip ball-grid-array (BGA) package for an integrated circuit (IC), in accordance with some embodiments.

It is to be understood that the following disclosure provides many different embodiments, or examples, for implementing different features of the embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 shows a schematic side view of a flip-chip ball-grid-array (BGA) package 100 for an integrated circuit (IC) 106, in accordance with some embodiments. The package includes a package substrate 101, balls 102, and bumps 103 on packages substrate 101, which are connected to bumps 104 on IC 106. Package 100 also has a heat sink 107 made of a material with a high coefficient of thermal conductivity. The heat sink 107 is made of one or more materials with high thermal conductivity, such as metal(s). The heat sink 107 includes a number of heat-dissipation-assisting structures, such as fins, pins, or ridges, 109, in accordance with some embodiments. The heat sink 107 shown in FIG. 1 is merely an example. Other configurations are also possible. For example, the heat sink 107 may include a fan (not shown) to assist cooling. The heat generated by IC 106 is transferred to the heat sink 107 by conduction. There is a thermal conductive layer 105 between the heat sink 107 and the IC 106 to ensure good contact between the surfaces of heat sink 107 and IC 106. The thermal conductive layer 105 is often made of thermal grease, such as G-751, X23-7762, X23-7783D, etc. Without the thermal conductive layer 105, the effective contact areas between the heat sink 107 and the IC 106 would be greatly reduced, which result in inefficient heat dissipation and higher temperature and a higher failure rate of IC 106.

The thermal conductivity of thermal grease, such as about 4.5 W/m° K for G-751, is higher than other typical oils, such as about 0.15 W/m° K for machine lubricating oil, or a liquid paste, such as about 0.35 W/m° K for epoxy. Metals, on the other hand, have much higher thermal conductivities. For example, the thermal conductivity of SnPb (63%/37%) solder is about 50 W/m° K. The thermal conductivity of copper is even higher at about 401 W/m° K. If metal is used to provide thermal conductive paths between the heat sink 107 and IC 106, the heat dissipation of IC 106 through heat sink 107 could be more efficient than thermal grease. However, it is not easy to use metal(s) as a thermal conductive layer 105, because the thermal conductive layer 105 needs to spread across the entire surface and adhere well with both the surface 108 of heat sink 107 and back surface 110 of IC 106. One would suggest using solder paste as the thermal conductive layer 105. However, a flux (a liquid) is often applied on the surface of metal and solder to prevent oxidation of solder during solder reflow. It's difficult for the flux to be removed from between two flat surfaces. Therefore, this is not an ideal option.

Figure 2A:
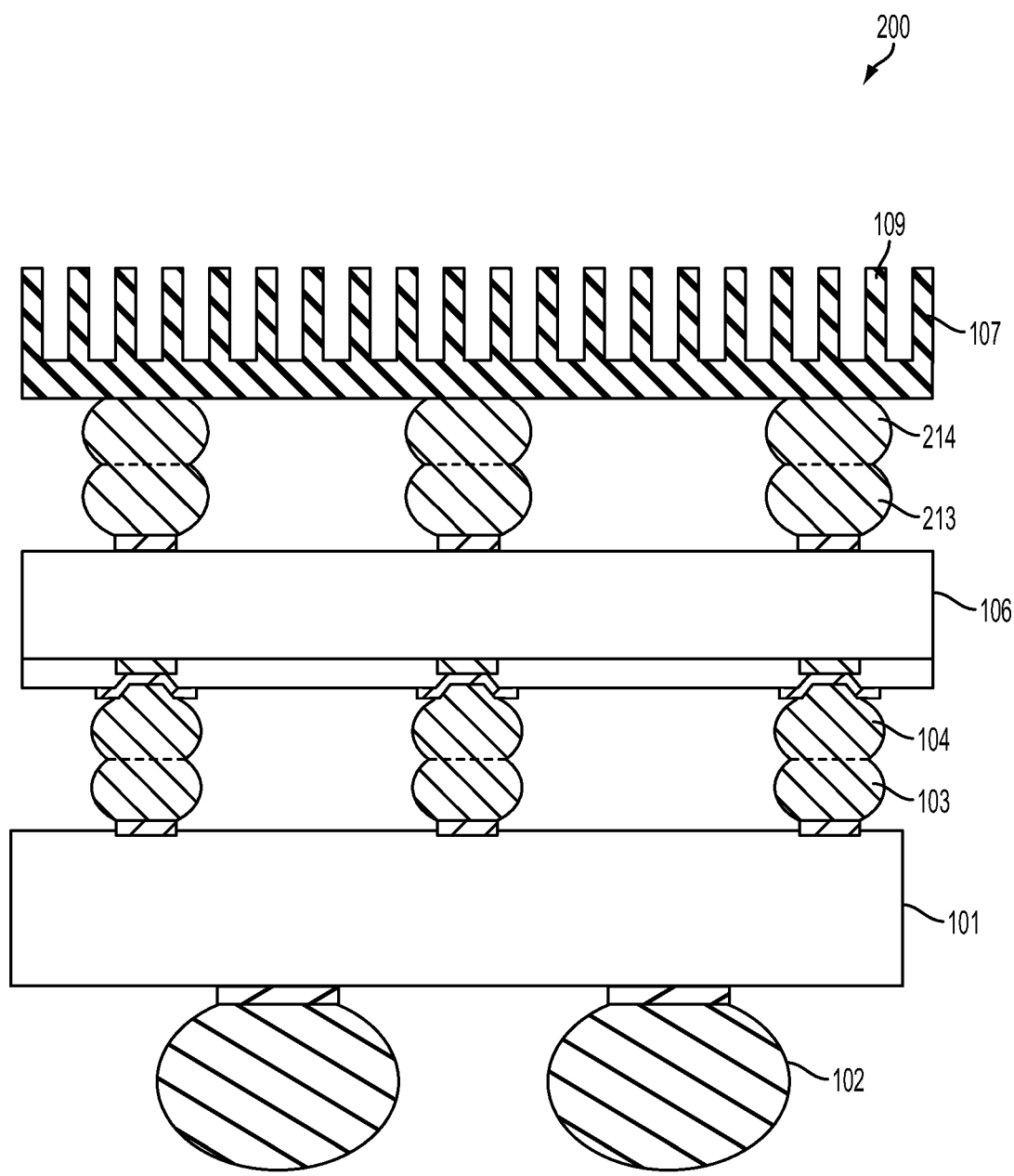
FIG. 2A shows a schematic side view of a flip-chip ball-grid-array (BGA) package for an integrated circuit (IC), in accordance with some embodiments.

FIG. 2A shows a schematic side view of a flip-chip ball-grid-array (BGA) package 200 for an integrated circuit (IC) 106, in accordance with some embodiments. Many components and configurations of package 200 are similar to those in package 100 of FIG. 1. However, the heat sink 107 and IC 106 of FIG. 2A are coupled or connected to each other via a number of bumps 213 on IC 106 and bumps 214 on heat sink 107, instead of the thermal conductive layer 105 of FIG. 1. In some embodiments, bumps 213 on IC 106 are soldered directly onto the back surface of heat sink 107 without bumps 214. However, the presence of bumps 214 on heat sink 107 has the benefits of better surface wetting during solder reflow and better alignment between IC 106 and heat sink 107. The interfacial boundaries between bumps 213 and 214 are not clear, because the bumps are reflowed (or heated) to make ensure that portions bumps 213 and 214 are melted together to ensure good contact. The bumps 213 and 214 could be solder bumps or copper posts, which are made of metals, which have much higher thermal conductivities than thermal grease used for the thermal conductive layer, as discussed above. By using bumps to make contacts between IC 106 and heat sink 107, the amount of heat dissipated and efficiency of heat dissipation could be increased. Flux can escape (or leave) the surfaces it comes in contact via the space between the bumps.

Figure 2B:
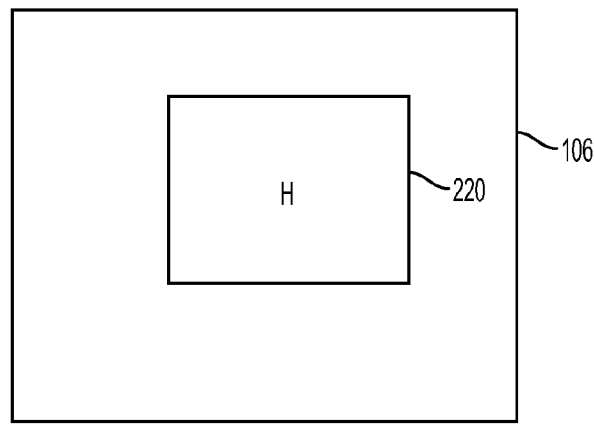
FIG. 2B shows a schematic top view of IC, in accordance with some embodiments.

In addition to the benefits mentioned above, there are also other benefits of using bumps to make contacts with heat sink(s). FIG. 2B shows a schematic top view of IC 106, in accordance with some embodiments. There are numerous devices on IC 106. FIG. 2B shows a region 220 (region H) on IC 106, which generates more heat than other regions of IC 106, in accordance with some embodiments. A higher number of bumps can be placed on region 220 to make contacts with heat sink 107 to enable the larger amount of heat generated in region 220 to be dissipated by heat sink 107 and to better balance the thermal stress caused by the larger amount of heat generated. Stress and thermal simulation can be used to determine the placement and number of bumps on IC 106 to optimize both the heat dissipation and stress balance.

Figure 2C:
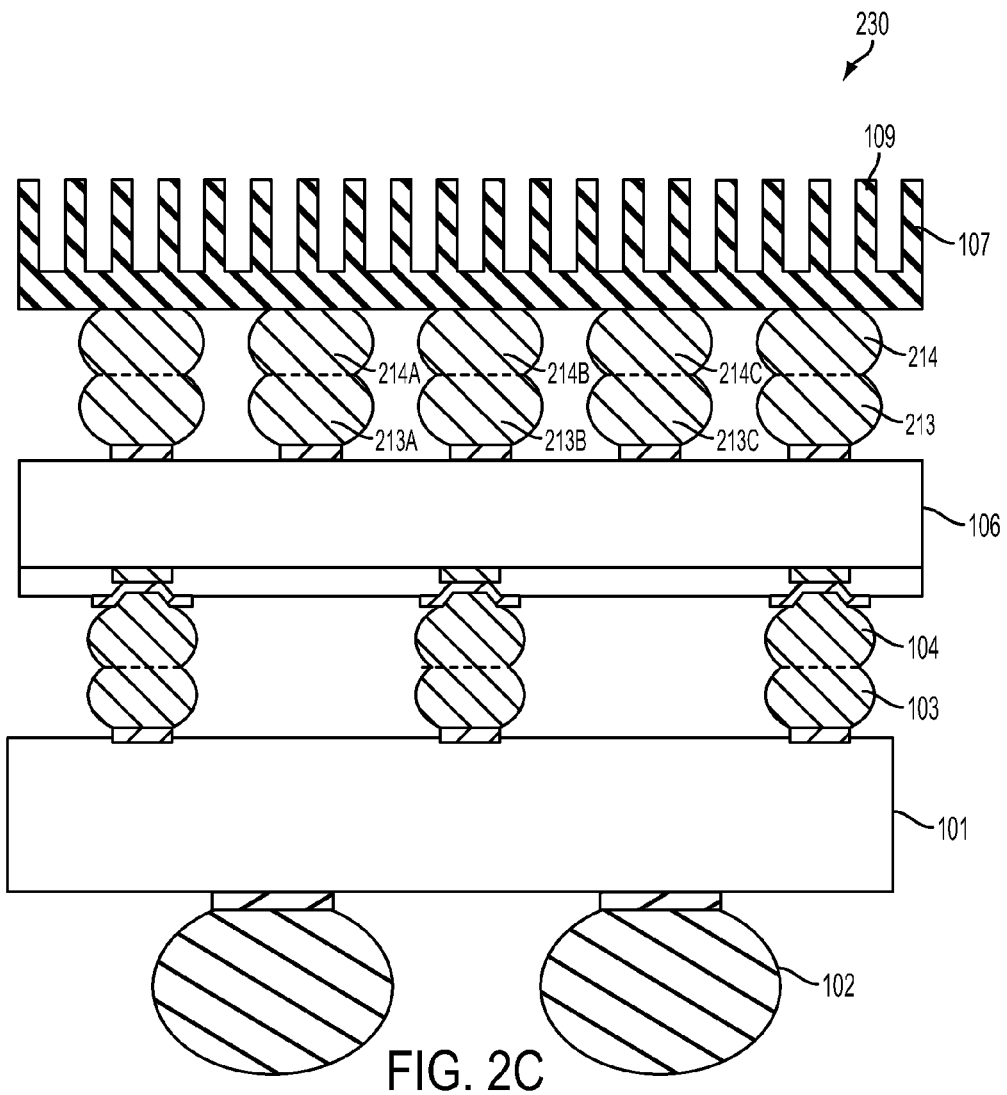
FIG. 2C shows a schematic side view of a flip-chip ball-grid-array (BGA) package for the integrated circuit (IC), in accordance with some embodiments.

FIG. 2C shows a schematic side view of a flip-chip ball-grid-array (BGA) package 230 for the integrated circuit (IC) 106, in accordance with some embodiments. The package 230 has a higher number of bumps 213 and 214, such as $213_A$, $213_B$, 213, $214_A$, $214_B$, and $214_C$, near the center of IC 106 and heat sink 107 to assist heat dissipation. Using bumps for thermal contacts enables customized design for thermal contacts between IC chip 106 and heat sink 107. Different bump designs for different products with different heat generation patterns on the ICs can be used to provide an optimum (or best) heat dissipation mechanism. The pattern of high center heat generation is only an example, and other embodiments are also possible. The locations and number (or layout) of metal bumps 213 on IC 106 (and correlating metal bumps 214 on heat sink 107) depend on the heat generation pattern on IC 106, in accordance with some embodiment. The layout can be metal bumps 213 can be customized according to different designs of IC 106.

Figure 2D:
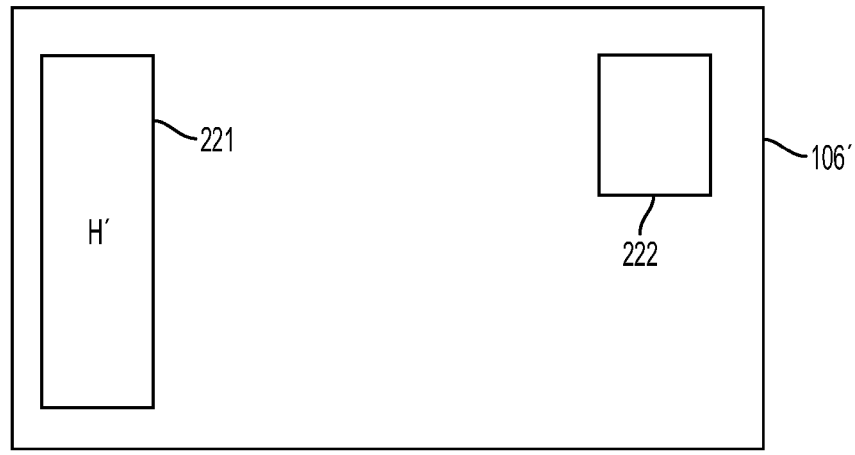
FIG. 2D shows two high generation regions on an IC, in accordance with some other embodiments.

FIG. 2D shows two high generation regions 221 and 222 on IC 106, in accordance with some other embodiments. A different bump design (or layout) for IC 106 and heat sink 107 for this different heat generation pattern could be used to best address the need of the IC. The discussion above mainly focuses on the design of corresponding bumps on IC 106 and heat sink 107. The design and/or configuration of the heat sink 107 may also be optimized to meet the need of the specific IC 106.

Figure 2E:
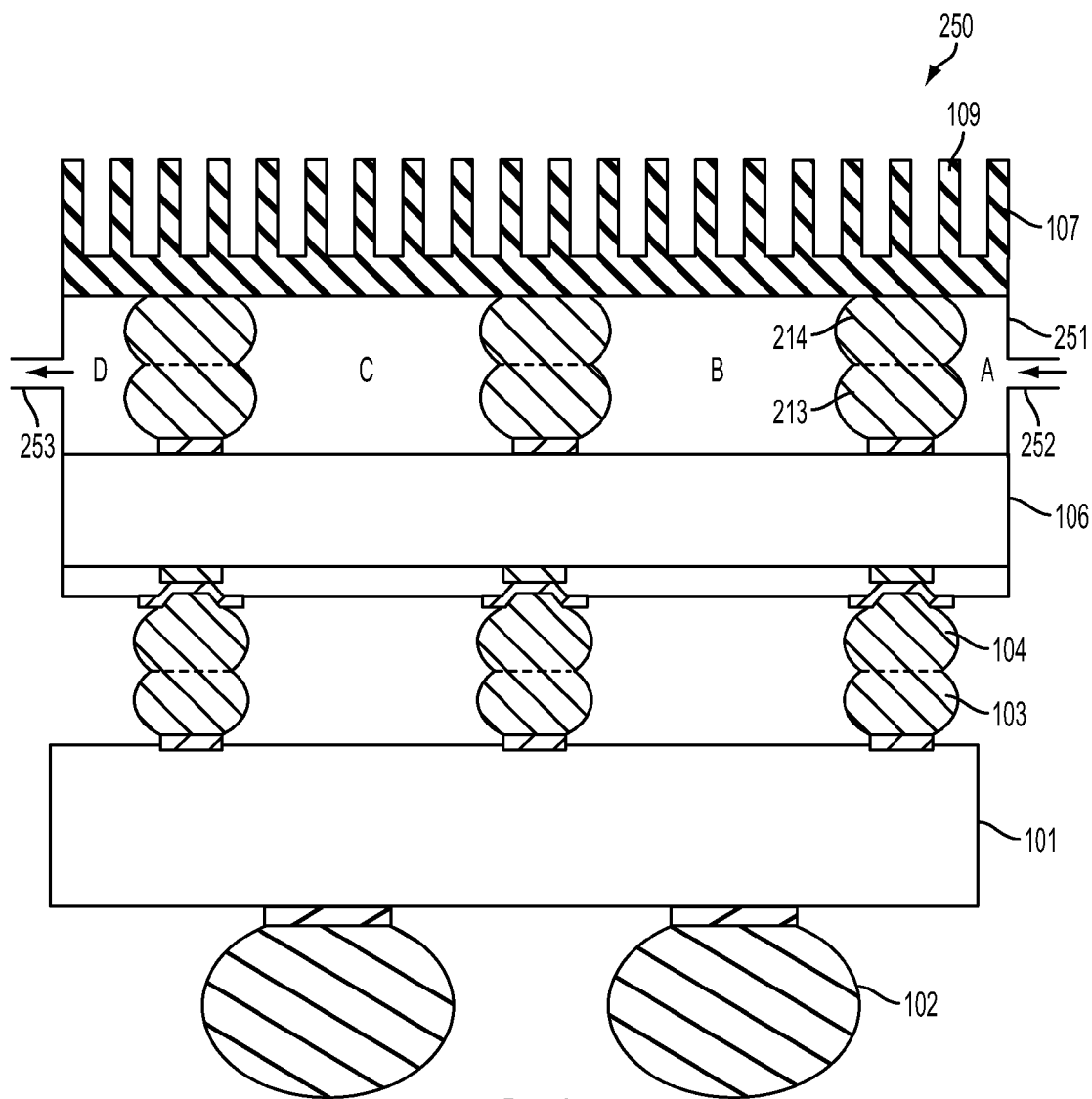
FIG. 2E shows a schematic side view of a flip-chip ball-grid-array (BGA) package for an integrated circuit (IC), in accordance with some embodiments.

In addition to the benefit of optimized heat dissipation by customizing bump designs, there are other possible benefits. FIG. 2E shows a schematic side view of a flip-chip ball-grid-array (BGA) package 250 for an integrated circuit (IC) 106, in accordance with some embodiments. FIG. 2E shows that the space between the heat sink 107 and IC 106 is enclosed by a casing 251. A fluid inlet 252 and a fluid outlet 253 are attached to the casing 251. A cooling fluid, which can be a liquid or a gas, can be flown from the inlet 252 through the channels, such as channels A, B, C and D, between the heat sink 107, the IC 106, and bumps 103 and 104. With the usage of the cooling fluid (or coolant), the heat dissipation can be further improved.

Figure 2F:
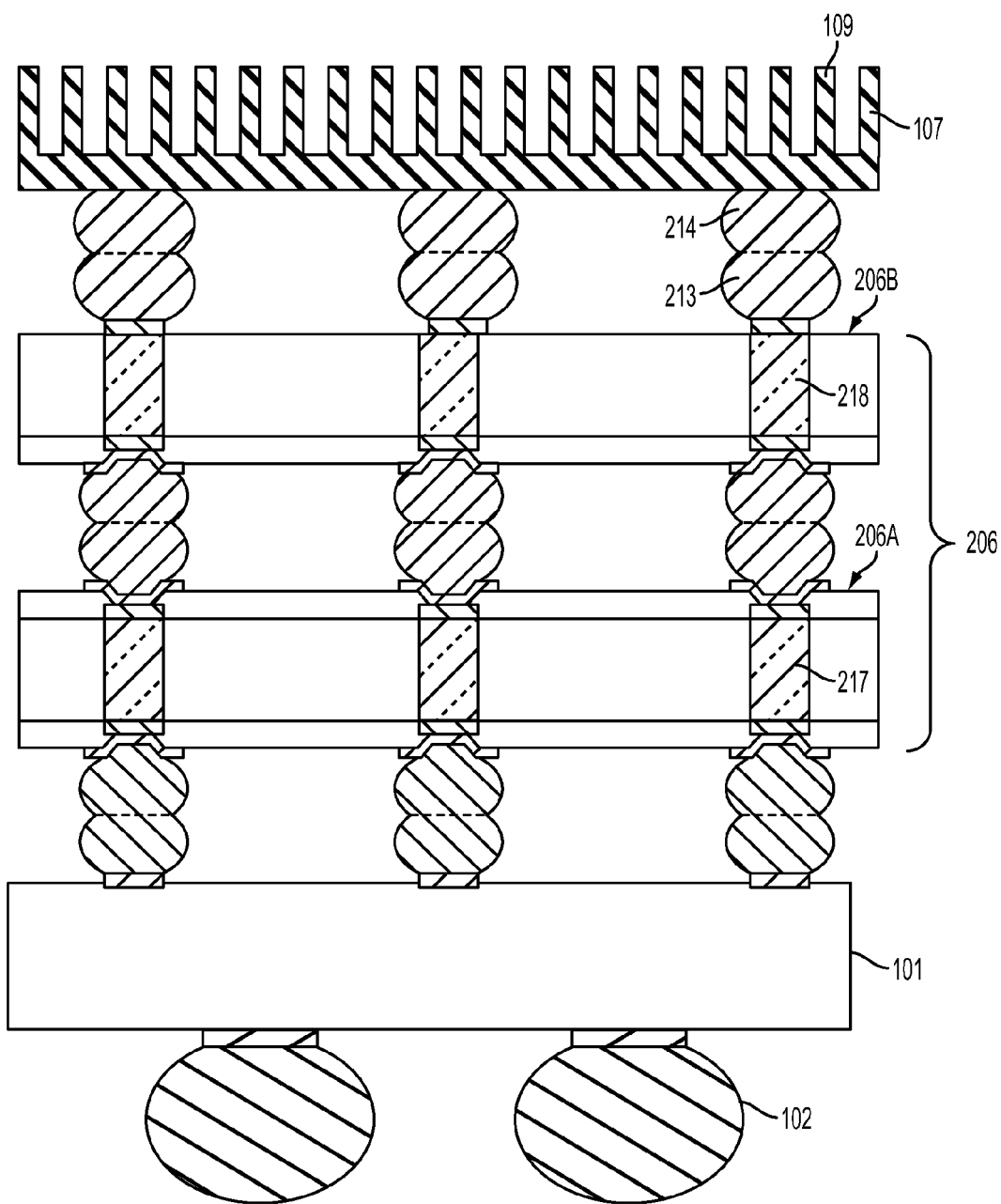
FIG. 2F shows a schematic side view of a flip-chip ball-grid-array (BGA) package for a three-dimensional (3D) IC (3DIC), in accordance with some embodiments.

The mechanisms described above may also apply to any type of ICs, including three-dimensional ICs (3DICs). FIG. 2F shows a schematic side view of a flip-chip ball-grid-array (BGA) package 270 for a 3DIC 206, in accordance with some embodiments. The 3DIC 206 includes Two ICs $206_A$ and $206_B$. In some embodiments, the 3DIC 206 has through silicon vias (TSVs) 217, 218 in ICs $206_A$ and $206_B$, respectively, in accordance with some embodiments. FIG. 2F shows that the bumps 213 are formed on TSVs, because TSVs can also help heat dissipation. However, the bumps that are connected to heat sink 107 may also be placed on metal surfaces that are not directly over or connected to TSVs. Alternatively, the 3DIC 206 may not include TSVs.

Figure 3A:
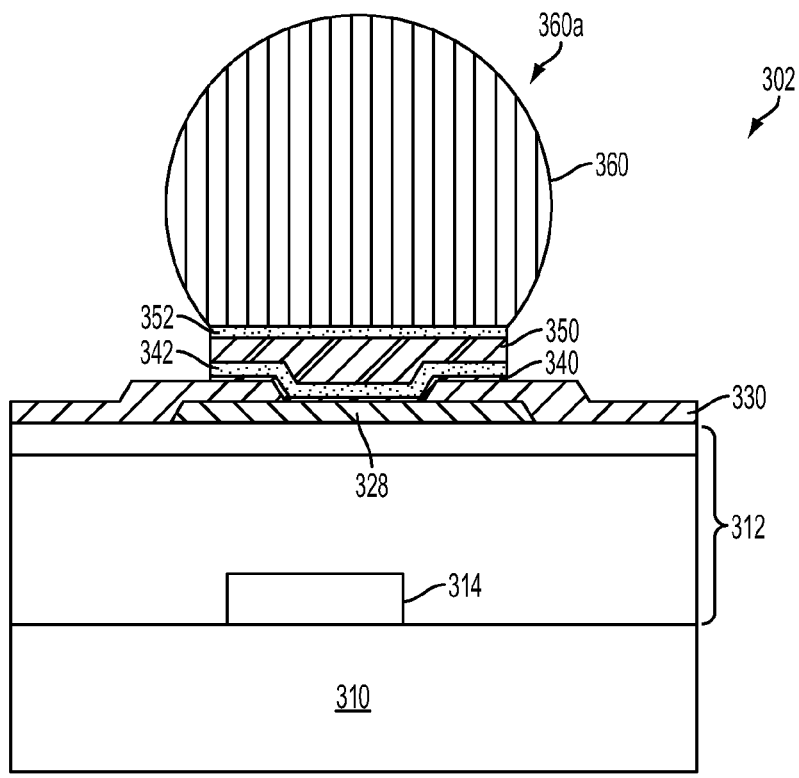
FIG. 3A shows a bump structure on a wafer, in accordance with some embodiments.

Structurally, a bump actually contains the bump itself and a so-called under bump metallurgy (UBM) layer located between the bump and an input/output (I/O) pad. FIG. 3A shows a bump structure on a wafer 302 with a substrate 310, in accordance with some embodiments. Substrate 310 may be a semiconductor substrate, such as a bulk silicon substrate, although it may include other semiconductor materials, such as group III, group IV, and/or group V elements. Semiconductor devices 314, such as transistors, may be formed at the surface of substrate 310. Interconnect structure 312, which includes metal lines and vias (not shown) formed therein and connected to semiconductor devices 314, is formed over substrate 310. The metal lines and vias may be formed of copper or copper alloys, and may be formed using the well-known damascene processes. Interconnect structure 12 may include commonly known inter-layer dielectrics (ILDs) and inter-metal dielectrics (IMDs).

Metal pad 328 is formed over interconnect structure 312. Metal pad 328 may comprise aluminum, and hence may also be referred to as aluminum pad 328. Although it may also be formed of, or include, other materials, such as copper, silver, gold, nickel, tungsten, alloys thereof, and/or multi-layers thereof. Metal pad 328 may be electrically connected to semiconductor devices 314, for example, through underlying interconnection structure 312. In some embodiments, a passivation layer 330 is formed to cover edge portions of metal pad 328. The passivation layer 330 may be formed of polyimide or other known dielectric materials. Additional passivation layers may be formed over interconnect structure 312 and at the same level, or over, metal pad 328. The additional passivation layers may be formed of materials such as silicon oxide, silicon nitride, un-doped silicate glass (USG), polyimide, and/or multi-layers thereof.

An opening is formed in passivation layer 330, with metal pad 328 exposed. A diffusion barrier layer 340 and a thin seed layer 342 are formed to cover the opening with the diffusion barrier layer 340 in contact with the metal pad 328. Diffusion barrier layer 340 may be a titanium layer, a titanium nitride layer, a tantalum layer, or a tantalum nitride layer. The materials of seed layer 342 may include copper or copper alloys, and hence is referred to as copper seed layer 342 hereinafter. However, other metals, such as silver, gold, aluminum, and combinations thereof, may also be included. In some embodiments, diffusion barrier layer 340 and copper seed layer 342 are formed using sputtering.

After the barrier layer 340 and copper seed layer 342 are formed, a mask is formed over the copper seed layer 342 to allow a copper layer 350 to be plated on the exposed surface of copper seed layer 342, in accordance with some embodiments. A metal layer 352 may be optionally formed on the copper layer 350. In some embodiments, metal layer 352 is a nickel-containing layer comprising, for example, a nickel layer or a nickel alloy layer deposited by plating. Next, solder layer 360 is formed on nickel layer 352, for example, by plating. Solder layer 360 may be a lead-free pre-solder layer formed of, for example, SnAg, or a solder material, including alloys of tin, lead, silver, copper, nickel, bismuth, or combinations thereof. During the formation of the mask, the residue may remain on the copper seed layer 342. The residue needs to be removed. The process is called "descum," which may result in oxidation of the copper seed layer 342. Oxidized surface of the copper seed layer 342 may affect the copper plating process. A reduction process may be involved to reduce the oxidized surface to copper.

Afterwards, the mask is removed. As a result, portions of copper seed layer 342 underlying the mask are exposed. The exposed portions of copper seed layer 342 are then removed by a flash etching. Next, the exposed portions of diffusion barrier layer 340 are also removed. A solder reflowing process is then performed to form solder layer 360 as a solder bump 360a, as shown in FIG. 3A.

Figure 3B:
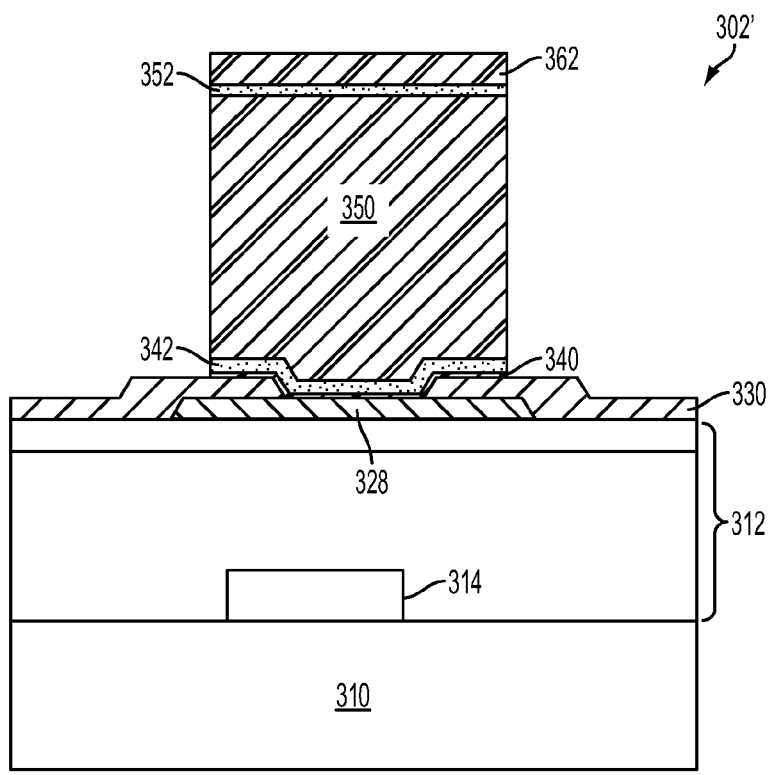
FIG. 3B shows a copper post structure on a wafer, in accordance with some embodiments.

In alternative embodiments, as shown in FIG. 3B, the thickness of copper layer 350 is increased so that copper layer 350 becomes a copper post (or pillar). In some embodiments, after the optional formation of metal layer 352 on copper post 350 and before the removal of the mask, solder layer 362, which may be a thin solder layer, may be plated on metal layer 352. As mentioned above, a bump actually contains the bump itself and a so-called under bump metallurgy (UBM) layer located between the bump and an input/output (I/O) pad. The diffusion barrier layer 340, the copper seed layer 342, the copper layer 350 and the copper layer of FIG. 3A can be combined together and be called a UBM layer. Similarly, the diffusion barrier layer 340 and the copper seed layer 342 of FIG. 3B can be combined together and be called a UBM layer.

The embodiments shown in FIGS. 3A and 3B are only two examples; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are hereby incorporated by reference in their entireties.

Figure 4A:
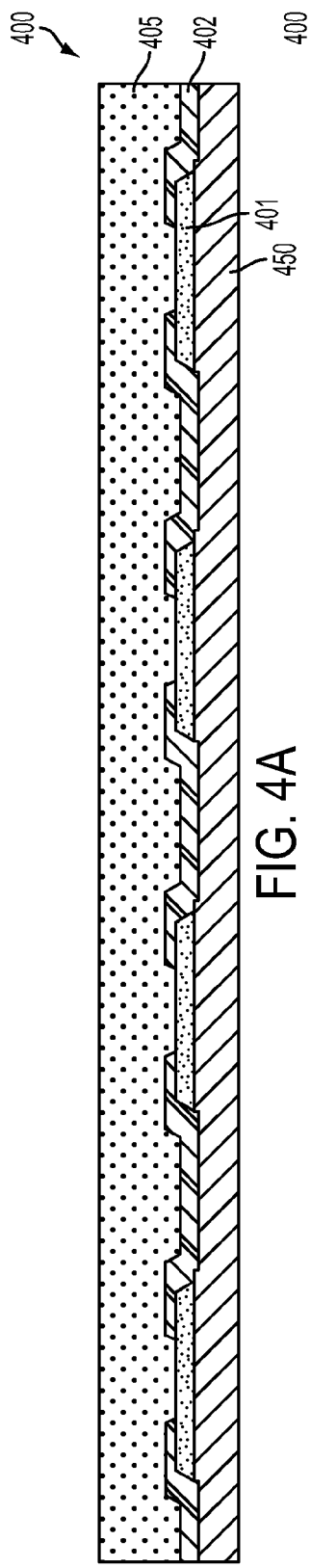
Figure 4B:
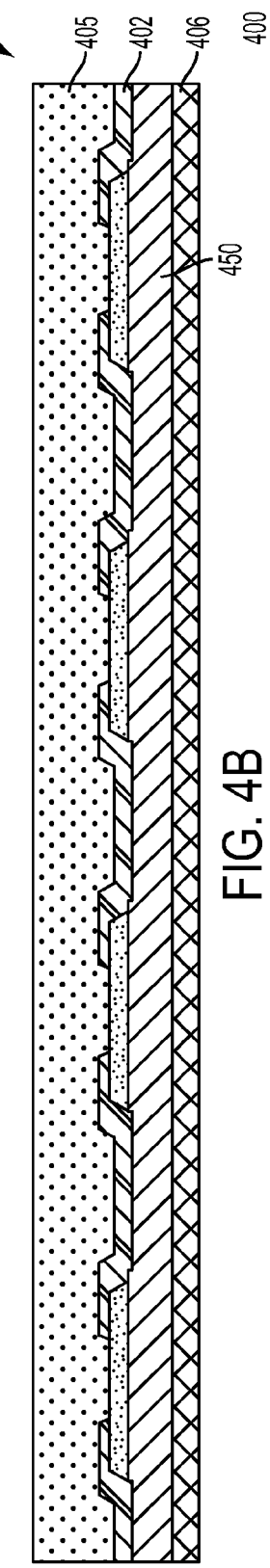

FIGS. 4A-4L show cross-sectional views of a region 400 of a substrate 450 with integrated circuits (ICs) in a sequential process flow to prepare bumps for connecting with a heat sink, in accordance with some embodiments. Devices (not shown) and interconnect (also not shown) are formed in substrate 450. Other structures, such as through silicon vias (TSVs) may also be formed on substrate 450 and are not shown here. FIG. 4A shows metal pads 401 are formed on substrate 450. The metal pads 401 could be above the surface of substrate 450 or be part of substrate 450 (i.e. in substrate 450). A passivation layer 402 is formed to cover the substrate 450 with portions of metal pads 401 exposed. A protective film 405 is deposited over substrate 450 to protect the front side of substrate 450. Protective film 405 protects the front side surface of substrate 450 during subsequent processing. Any film that can be placed on substrate 450 to protect the front side surface may be used. In some embodiments, protective film 405 is made of conventional photoresist, which is in liquid form and is deposited by a spin-on process. In some other embodiments, the material of protective film 405 is a dry film resist (DFR).

Figure 4C:
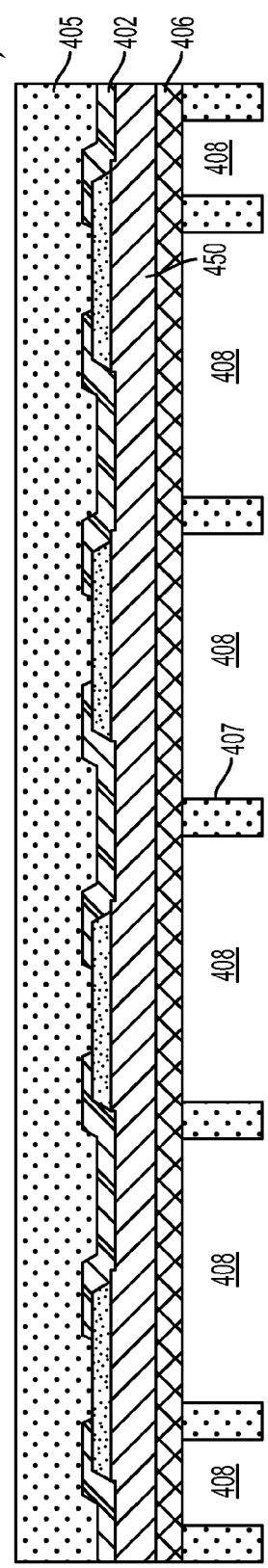

After protective film 405 is deposited, the backside of substrate 450 is deposited with a UBM layer 406. Exemplary sub-layers of an UBM layer has been discussed above. After the UBM layer 406 is deposited on the backside of substrate 450, the backside of substrate 450 is patterned with a patterning layer 407, as shown in FIG. 4C in accordance with some embodiments. The material used for the patterning layer 407 could be a conventional photoresist, which is in liquid form and is deposited by a spin-on process, in accordance with some embodiments. In another embodiment, the material of protective film 405 is a dry film resist (DFR), which can also be patterned by photolithography (i.e. with light exposure). The DFR can be a positive or a negative photoresist. DFR has been used for creating patterns for copper plating for circuit boards. An example of DFR is MP112, made by TOK CO. LTD. of Japan. After the patterning layer 407 is deposited, layer 407 is patterned by lithography and etching to create openings 408, which will be filled with bump metal at a later operation.

FIG. 4D shows a bump metal layer 409 used to fill the openings 408 of FIG. 4C, in accordance with some embodiments. The bump metal 409 can be deposited by physical vapor deposition (PVD, or sputtering), chemical vapor deposition (CVD), or plating. The excess bump metal outside the openings 408 is then removed by etching or by chemical-mechanical polishing (CMP). After the excess bump metal is removed, the backside of substrate 450 is covered with a protective film 410, as shown in FIG. 4E, in accordance with some embodiments. The protective film 410 protects the back side surface of substrate 450 during subsequent processing. The function of protective film 410 is similar to protective film 405; therefore, protective film 410 can be made of material(s) similar to protective film 405.

Figure 4F:
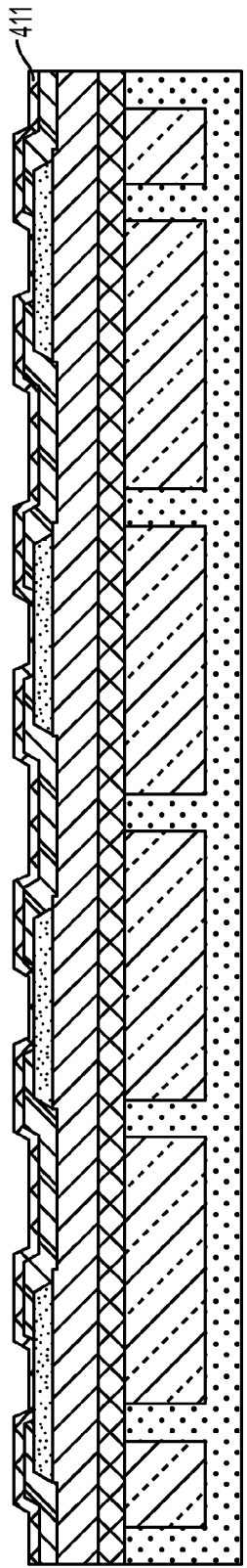
Figure 4G:
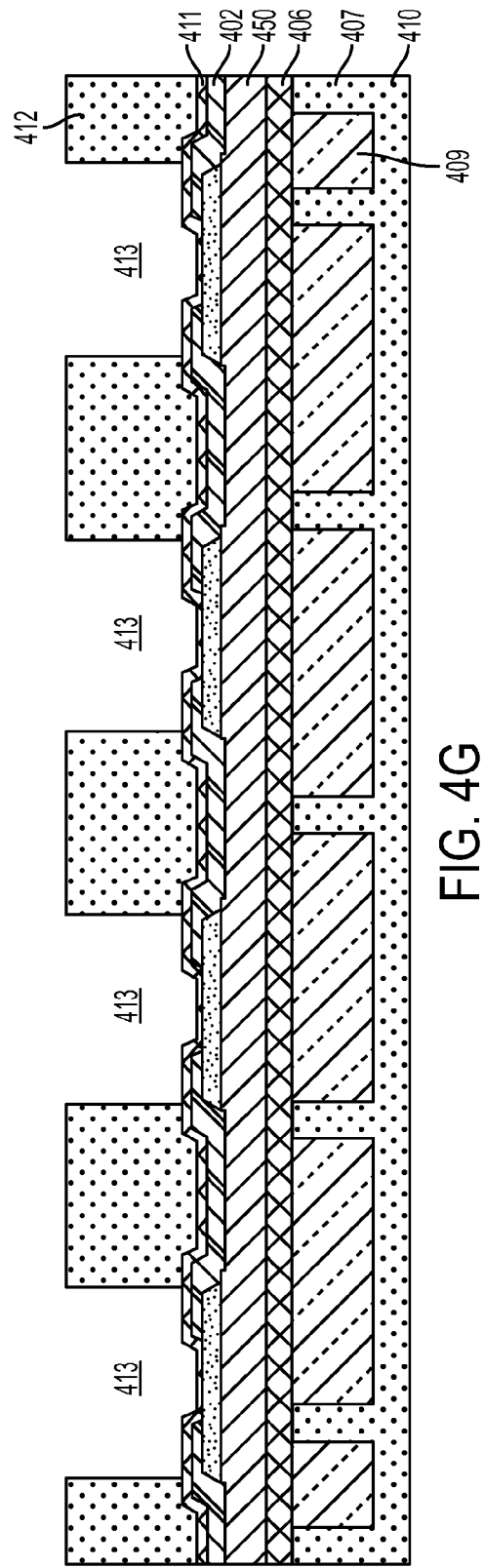

After the backside protective film 410 is deposited, the front side protective film 405 is removed and an UBM layer 411 is deposited to cover the front side surface of substrate 450, as shown in FIG. 4F in accordance with some embodiments. The UBM layer 411 could include more than one sub-layers, as described above in FIGS. 3A and 3B. After the deposition of the UBM layer 411, the front side of substrate 450 is patterned with a patterning layer 412, as shown in FIG. 4G in accordance with some embodiments. Because the function of the patterning layer 412 is similar to patterning layer 407, materials suitable for layer 407 are also suitable for layer 412. After the patterning layer 412 is deposited, layer 412 is patterned by lithography and etching to create openings 413, which will be filled with bump metal at a later operation.

Figure 4H:
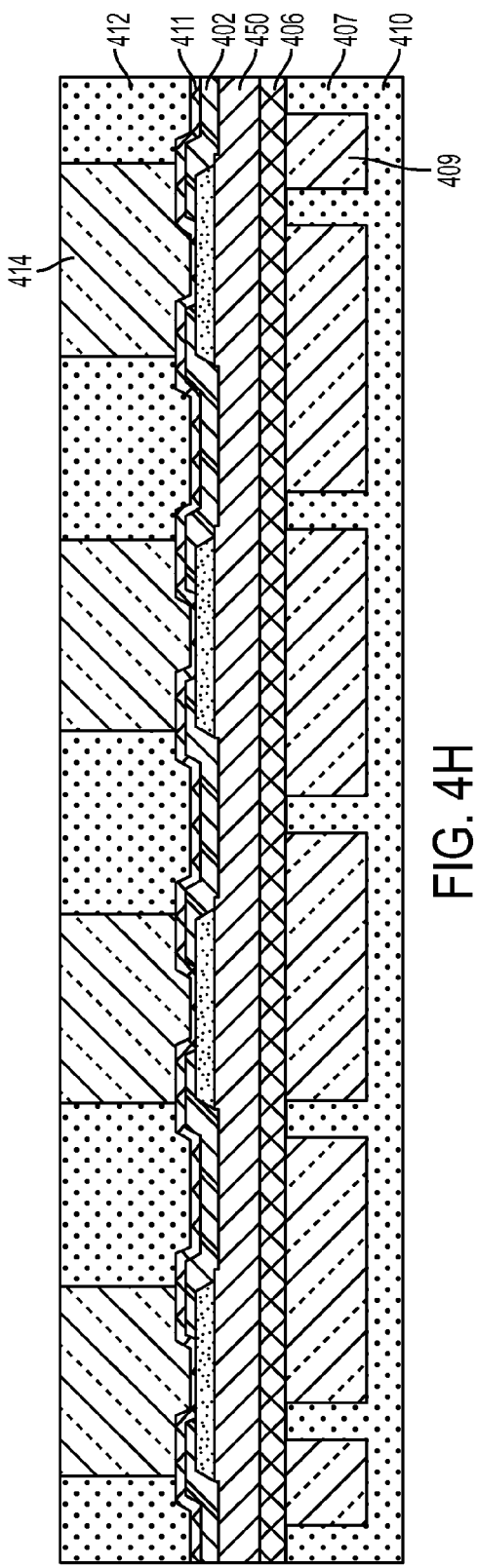
Figure 4I:
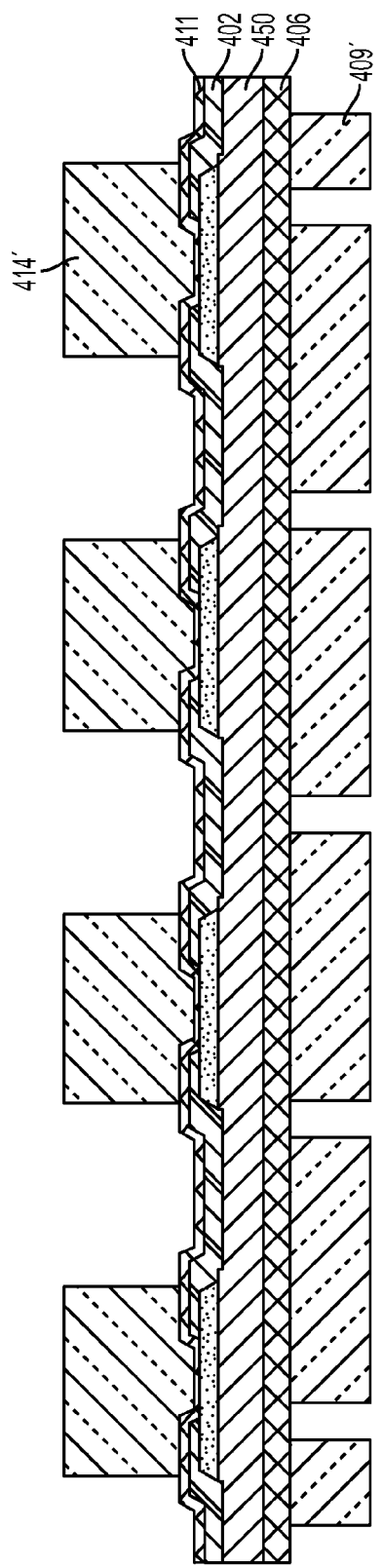

FIG. 4H shows that a bump metal layer 414 is used to fill the openings 413 of FIG. 4G, in accordance with some embodiments. The materials for bump metal layer 414 and their deposition methods have been described above. In some embodiments, the bump metal layer 414 is plated on substrate 450. The excess bump metal outside the openings 413 is then removed by etching or by chemical-mechanical polishing (CMP). After the excess bump metal is removed, the remaining patterning layer 412 is removed, as shown in FIG. 4I in accordance with some embodiments. After the removal of the remaining patterning layer 412, metal bumps 414' remain on the front side of substrate 450. The backside protective film 410 is also removed to expose the back side metal bumps 409', as shown in FIG. 4I in accordance with some embodiments.

After the remaining patterning layer 412 is removed and also the backside protective film 410 is removed, the exposed UBM layers 406 and 411 are removed, in accordance with some embodiments. FIGS. 4J and 4K show that the UBM layer 411 is removed first and UBM layer 406 is removed afterwards, in accordance with some embodiments. However, the order of UBM removal can be reversed, in some embodiments. After the exposed UBM layers are removed, the bump metal layers 409 and 414 are then reflowed to form metal bumps 409' and 414', as shown in FIG. 4L, in accordance with some embodiments. To reflow a substrate with both front side and backside bumps, such as substrate 450, the edge of the substrate is held by a device and the hot inert gas, such as $N_2$, He, Ne, Ar, Kr, or Xe, are blown on the substrate surface or surfaces to heat the substrate, in accordance with some embodiments. After reflow is completed, substrate 450 is ready to be packaged with other components, such as heat sink 107 and/or package substrate 101.

Figure 5:
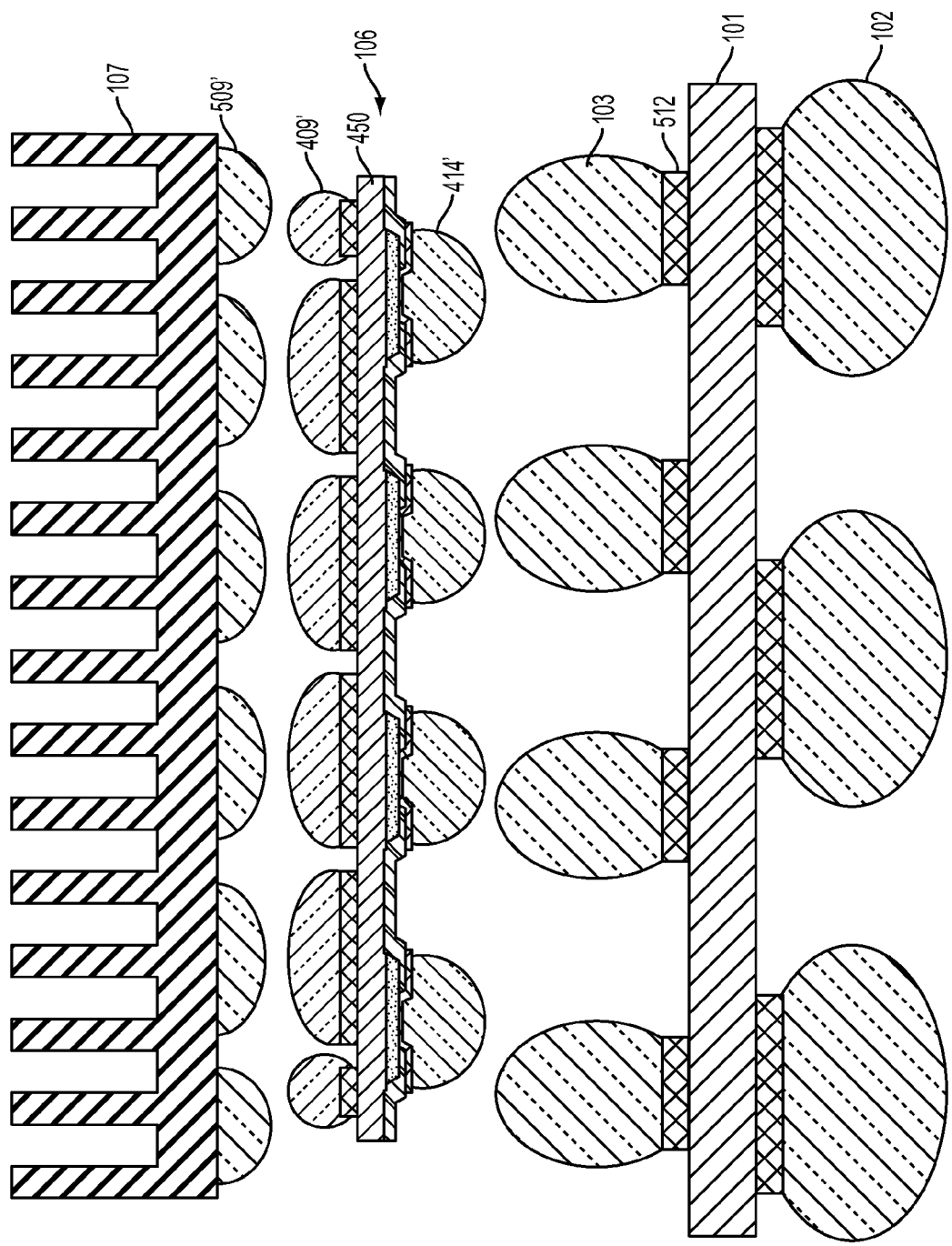
FIG. 5 shows a substrate being positioned between a heat sink and a package substrate, in accordance with some embodiments.

FIG. 5 shows substrate 450 positioned between a heat sink 107 and a package substrate 101, in accordance with some embodiments. The heat sink 107 has a number of metal bumps 509' (similar to bumps 214 of FIGS. 2A and 2C) that are placed in positions that correlate to the positions of the metal bumps 409' (similar to bumps 213 of FIGS. 2A and 2C) of substrate 450, which is the substrate IC 106 in FIG. 1. Similarly, the package substrate 101 also has a number of metal bumps 103 that are placed in positions that correlate to the positions of the metal bumps 414' on substrate 450. In the embodiments shown in FIG. 5, there is a UBM layer 512 under the metal bumps 103. In addition, on the other side of package substrate 101, there are a number of balls 102, which can be solder balls used to form connections with a board. Because the heat sink 107 is merely used as a heat dissipation device (or cooling device), a UBM layer is not formed between the metal bumps 509' and the heat sink 107. However, a UBM layer may be formed between the metal bumps 509' and the heat sink 107.

The cross-sectional views of a sequential process flow to prepare metal bumps on the front side and back side of substrate 450 shown in FIGS. 4A-4L are merely exemplary. Other processing sequences are also possible. For example, in the processing sequence shown in FIGS. 4A-4L, the backside bumps are deposited first. Alternatively, the front side bumps can be deposited first (or before the deposition of the backside bumps). Further the UBM layers 406 and 411 can be formed during operations that are in different sequence from the ones shown in FIGS. 4A-4L. According to embodiments, the UBM layer 411 for the front side bumps 414' is formed before the deposition of the metal bump layer 414. Similarly, the backside UBM layer 406 is formed before the deposition of the backside metal bump layer 409. In addition, the removal of the excess UBM layers 406 and 411 can be performed any time after the individual metal bump layers 409 and 414 are formed. Although BGA packaging is described above, using metal bumps to make connections between IC chip 106 and heat sink(s) 107 (or a cooling device) is not limited to BGA packaging. IC 106 may be placed on other types of packages.

The mechanisms of forming metal bumps to connect to a cooling device (or a heat sink) described above enable substrates with devices to dissipate heat generated more efficiently. In addition, the metal bumps allow customization of bump designs to meet the needs of different chips. Further, the usage of metal bumps between the semiconductor chip and cooling device enables advanced cooling by passing a cooling fluid between the bumps.

In one embodiment, a packaged substrate with a heat sink is provided. The package substrate includes a packaging substrate, a heat sink, and a semiconductor substrate. The semiconductor substrate has a plurality of first-side metal bumps on a first side of the substrate physically connected to the packaging substrate. The semiconductor substrate has a plurality of second-side metal bumps on a second side of the semiconductor substrate physically connected to the heat sink. The first side and the second side of the semiconductor substrate are on opposite sides of the semiconductor substrate.

In another embodiment, a packaged three-dimensional integrated circuit (3DIC) with a heat sink is provided. The packaged 3DIC includes a packaging substrate, a heat sink, and a 3DIC. The 3DIC includes at least two levels of integrated circuits (ICs), and the 3DIC has a plurality of first-side metal bumps on a first side of the 3DIC physically connected to the packaging substrate. The 3DIC has a plurality of second-side metal bumps on a second side of the 3DIC physically connected to the heat sink, and wherein the first side and the second side of the 3DIC are on opposite sides of the substrate.

In yet another embodiment, a method of preparing a semiconductor substrate with metal bumps on both sides of the substrate is provided. The method includes depositing a first-side UBM layer on a first surface of the semiconductor substrate, and forming a plurality of first-side metal bumps on the first surface of the semiconductor substrate after the first-side UBM layer is deposited. The method also includes forming a second-side UBM layer on a second side of the semiconductor substrate, and the first surface and the second surface are opposite of each other. The method further includes forming a plurality of second-side metal bumps on the second surface of the semiconductor substrate after the second-side UBM layer is deposited. In addition, the method includes removing exposed first-side UBM layer and exposed second-side UBM layer after the plurality of first-side metal bumps and the plurality of second-side metal bumps are formed. Additionally, the method includes reflowing the plurality of first-side metal bumps and the plurality of second side metal bumps.

Various modifications, changes, and variations apparent to those of skill in the art may be made in the arrangement, operation, and details of the methods and systems disclosed. Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and are not to be limited to the details given herein, but may be modified within the scope and equivalents of the embodiments described.

The invention claimed is:

1. A packaged substrate with a heat sink, comprising:
   a packaging substrate;
   a heat sink; and
   a semiconductor substrate, wherein the semiconductor substrate has a plurality of first-side metal bumps on a first side of the substrate physically connected to the packaging substrate, and wherein the semiconductor substrate has a plurality of second-side metal bumps on a second side of the semiconductor substrate physically connected to the heat sink, and wherein the first side and the second side of the semiconductor substrate are on opposite sides of the semiconductor substrate, the semiconductor substrate has a first region configured to generate a higher amount of heat than a second region of the semiconductor substrate, and a number of second-side metal bumps of the plurality of second-side metal bumps per unit area in the first region is greater than a number of second-side metal bumps of the plurality of second-side metal bumps per unit area in the second region.

2. The packaged substrate of claim 1, wherein the semiconductor substrate is an integrated circuit (IC).

3. The packaged substrate of claim 1, wherein the packaging substrate has a ball-grid-array (BGA) on one side and is physically connected to the semiconductor substrate via metal bumps on the opposite side from the BGA, wherein locations of the metal bumps on the packaging substrate correlate to locations of the plurality of first-side metal bumps on the semiconductor substrate.

4. The packaged substrate of claim 1, wherein the heat sink has a plurality of pins, fins, or ridges.

5. The packaged substrate of claim 4, wherein there are metal bumps on the heat sink on an opposite side of the plurality of pins, fins, or ridges, wherein locations of the metal bumps on the heat sink correlate to locations of the plurality of second-side metal bumps on the semiconductor substrate.

6. The packaged substrate of claim 1, the plurality of first-side metal bumps and the plurality of second-side metal bumps are solder bumps or copper posts.

7. The packaged substrate of claim 6, wherein there is a first under bump metallurgy (UBM) layer under the plurality of first-side metal bumps and a second UBM layer under the plurality second-side metal bumps.

8. The packaged substrate of claim 1, further comprising a casing between the semiconductor substrate and the heat sink, wherein the casing comprises:
 a fluid inlet configured to introduce a cooling fluid into the casing; and
 a fluid outlet configured to allow the cooling fluid to exit the casing.

9. A packaged three-dimensional integrated circuit (3DIC) with a heat sink, comprising:
 a packaging substrate;
 a heat sink;
 a 3DIC, wherein the 3DIC includes at least two levels of integrated circuits (ICs), and wherein the 3DIC has a plurality of first-side metal bumps on a first side of the 3DIC physically connected to the packaging substrate, and wherein the 3DIC has a plurality of second-side metal bumps on a second side of the 3DIC physically connected to the heat sink, and wherein the first side and the second side of the 3DIC are on opposite sides of the substrate, and a number of second-side metal bumps of the plurality of second-side metal bumps per unit area of the second side is lower at a center of the 3DIC than at a peripheral location of the 3DIC; and
 a casing between the 3DIC and the heat sink, wherein the casing comprises:
  a fluid inlet configured to introduce a cooling fluid into the casing; and
  a fluid outlet configured to allow the cooling fluid to exit the casing.

10. The packaged 3DIC of claim 9, wherein the 3DIC has through silicon vias.

11. The packaged 3DIC of claim 9, wherein the packaging substrate has a ball-grid-array (BGA) on one side and is physically connected to the 3DIC through metal bumps on the opposite side from the BGA, wherein locations of the metal bumps on the packaging substrate correlate to locations of the plurality of first-side metal bumps on the 3DIC.

12. The packaged substrate of claim 9, wherein there are metal bumps on the heat sink on an opposite side of the plurality of pins, fins, or ridges on the heat sink, wherein locations of the metal bumps on the heat sink correlate to locations of the plurality of second-side metal bumps on the 3DIC.

13. The packaged substrate of claim 9, wherein the locations and number of the plurality of the second-side metal bumps depend on the heat generation pattern on the 3DIC.

14. A packaged substrate with a heat sink, comprising:
 a packaging substrate;
 a heat sink;
 a semiconductor substrate, wherein the semiconductor substrate has a plurality of first-side metal bumps on a first side of the substrate physically connected to the packaging substrate, and wherein the semiconductor substrate has a conductive material attached to the heat sink on a second side of the substrate, and wherein the first side and the second side of the semiconductor substrate are on opposite sides of the semiconductor substrate; and
 a casing between the semiconductor substrate and the heat sink, wherein the casing comprises:
  a fluid inlet configured to introduce a cooling fluid into the casing; and
  a fluid outlet configured to allow the cooling fluid to exit the casing.

15. The packaged substrate of claim 14, wherein the conductive material comprises a thermal grease.

16. The packaged substrate of claim 14, wherein the conductive material comprises a plurality of bumps.

17. The packaged substrate of claim 14, wherein the cooling fluid is a gas.

18. The packaged substrate of claim 16, wherein each bump of the plurality of bumps comprises:
 a copper layer over the semiconductor substrate;
 a metal layer over the copper layer; and
 a solder layer over the metal layer.

19. The packaged substrate of claim 18, wherein the metal layer comprises nickel and the solder layer comprises a lead-free solder.

20. The packaged substrate of claim 14, wherein the cooling fluid is a liquid.

* * * * *